(12) United States Patent
Keum

(10) Patent No.: US 7,112,537 B2
(45) Date of Patent: Sep. 26, 2006

(54) METHOD OF FABRICATING INTERCONNECTION STRUCTURE OF SEMICONDUCTOR DEVICE

(75) Inventor: Dong-Yeal Keum, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,850

(22) Filed: Dec. 30, 2004

(65) Prior Publication Data
US 2005/0142856 A1 Jun. 30, 2005

(30) Foreign Application Priority Data
Dec. 31, 2003 (KR) .............. 10-2003-0101823

(51) Int. Cl.
*H01L 21/302* (2006.01)
*H01L 21/461* (2006.01)
(52) U.S. Cl. ............ 438/738; 438/740; 257/E21; 257/577; 257/579
(58) Field of Classification Search .......... 438/700, 438/270, 692, 734, 735, 738, 740, 311
See application file for complete search history.

(56) References Cited

U.S. PATENT DOCUMENTS

| | | | | |
|---|---|---|---|---|
| 6,350,672 B1* | 2/2002 | Sun | ............. | 438/619 |
| 6,395,632 B1* | 5/2002 | Farrar | ............. | 438/687 |
| 6,451,683 B1* | 9/2002 | Farrar | ............. | 438/622 |
| 6,534,835 B1* | 3/2003 | Farrar | ............. | 257/369 |
| 6,573,572 B1* | 6/2003 | Farrar | ............. | 257/386 |
| 6,649,522 B1* | 11/2003 | Farrar | ............. | 438/687 |

FOREIGN PATENT DOCUMENTS

JP 2001-168188 6/2001

* cited by examiner

*Primary Examiner*—David Nhu
(74) *Attorney, Agent, or Firm*—Oblon, Spivak, McClelland, Maier & Neustadt, P.C.

(57) ABSTRACT

A method of fabricating an interconnection structure of a semiconductor device includes the steps of successively depositing an etch-stop layer and an intermetal insulating layer on a semiconductor substrate, forming a sacrificial insulating layer on the intermetal insulating layer, forming a photoresist pattern on the sacrificial insulating layer to define a trench formation region, etching the intermetal insulating layer using a mask of the photoresist pattern to form a trench, and etching the entire etch-stop layer.

13 Claims, 6 Drawing Sheets

METHOD OF FABRICATING INTERCONNECTION STRUCTURE OF SEMICONDUCTOR DEVICE

FIELD OF THE INVENTION

The present invention relates to a method of fabricating an interconnection structure in a semiconductor device using a damascene pattern.

DESCRIPTION OF THE RELATED ART

As semiconductor devices becomes more highly integrated and manufacturing technology becomes remarkably improved, copper (Cu) is more widely used instead of aluminum (Al) for forming metal interconnections to enhance device properties such as device speed, resistance, parasitic capacitance between metal interconnections, etc. Also, to form intermetal insulating layers, low dielectric constant (Low-k) materials are being spotlighted rather than oxide layers in post-interconnection processes.

However, Cu shows very poor etching properties. For this reason, a damascene process has been proposed as a suitable process for fabricating interconnection lines using Cu and low dielectric constant materials.

According to a typical damascene process, a damascene pattern is formed in an intermetal insulating layer and a Cu layer is sufficiently deposited to fill a contact hole. Then, annealing is performed to the deposited Cu layer and impurities introduced during deposition of Cu are removed. Chemical mechanical polishing (CMP) is then performed until an upper surface of the intermetal insulating layer is exposed, thereby completing a Cu interconnection filled in the damascene pattern. Here, the damascene pattern can be divided into two patterns, a dual damascene and a single damascene pattern. The former has a via hole to connect an upper interconnection line with a lower interconnection line, and a trench having an upper interconnection line. The latter has only a trench with an upper interconnection line.

Meanwhile, in the typical damascene process, an etch-stop layer is provided to prevent the etching from attacking the underlying structure when the etching is performed to expose the partial wafer using the damascene pattern in the intermetal insulating layer.

However, as recognized by the present inventor, when removing the etch-stop layer which is formed on the wafer to reduce interface resistance of the Cu layer and the wafer after the formation of the damascene pattern, the intermetal insulating layer formed at each opening portion of the damascene pattern is partially removed along with the etch-stop layer, so that the opening sidewalls of the damascene pattern are rounded and the opening width becomes broader. As the reduced design rules are pursued to accommodate higher packing densities, this broadening of the opening width of the via hole leads to problems of a leakage current and the possibility of the Cu bridging (the unintentional electrical connection between the Cu used to fill one via hole with Cu used to fill an adjacent via hole) which adjacent interconnection lines are connected to each other, in the fabrication of interconnection lines.

SUMMARY OF THE INVENTION

One technical objective of the present invention is to provide a method of fabricating an interconnection structure of a semiconductor device, which prevents a bridge phenomenon in which adjacent interconnection lines are connected with each other as device packing densities increase, thereby imparting stable properties and operation of the device.

To address the above-identified and other limitations of conventional processes, according to an aspect of the present invention, there is provided a method of fabricating an interconnection structure of a semiconductor device including the steps of: successively depositing an etch-stop layer and an intermetal insulating layer on a semiconductor substrate; forming a sacrificial insulating layer on the intermetal insulating layer; forming a photoresist pattern on the sacrificial insulating layer to define a trench formation region; etching the intermetal insulating layer using a mask of the photoresist pattern to form a trench; and etching the entire etch-stop layer.

Here, the sacrificial insulating layer is preferably formed of nitride series materials.

Preferably, the sacrificial insulating layer has a thickness equal to or thicker than that of the etch-stop layer by as much as a factor of two (i.e., not smaller than 50% of the thickness of the etch stop layer), and the intermetal insulating layer is formed as plural layers using oxide series materials.

Also preferably, the method further includes of the steps of: forming a diffusion barrier on the intermetal insulating layer including the trench after the entire etch-stop layer is removed; depositing a conductive layer on the diffusion barrier to fill the trench; annealing the conductive layer; and polishing the conductive layer and the diffusion barrier by chemical mechanical polishing until the upper surface of the intermetal insulating layer is exposed and planarized.

The conductive layer is preferably formed of copper.

According to another aspect of the present invention, there is provided a method of fabricating an interconnection structure of a semiconductor device including the steps of: successively depositing an etch-stop layer and an intermetal insulating layer on a semiconductor substrate; forming a sacrificial insulating layer on the intermetal insulating layer; forming a first photoresist pattern on the sacrificial insulating layer to define a via hole formation region; forming a second photoresist pattern on the sacrificial insulating layer to define a trench formation region; selectively etching the partial intermetal insulating layer using a mask of the second photoresist pattern to form a dual damascene pattern; and etching the entire etch-stop layer.

Preferably, the selective etching step of the partial intermetal insulating layer using a mask of the second photoresist pattern to form a dual damascene pattern is achieved by the steps of: filling the via hole with a non-photoresist material to protect the etch-stop layer; etching the partial intermetal insulating layer using a mask of the second photoresist pattern to form a trench; and completely removing the non-photoresist material.

Also, preferably, the method includes the steps of: forming a diffusion barrier on the intermetal insulating layer including the dual damascene pattern after the entire etch-stop layer is removed; depositing a conductive layer on the diffusion barrier to fill the trench; annealing the conductive layer; and polishing the conductive layer and the diffusion barrier by chemical mechanical polishing (CMP) until the upper surface of the intermetal insulating layer is exposed and planarized.

As an alternative to forming and them removing the sacrificial layer, a CMP process may be employed to planarize the upper-level area of the via hole to remove the rounded corners of the via hole.

BRIEF DESCRIPTION OF THE DRAWINGS

The above objects and other advantages of the present invention will become more apparent by describing the preferred embodiments thereof in more detail with reference to the accompanying drawings.

DETAILED DESCRIPTION OF THE INVENTION

Preferred embodiments of the present invention will now be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of the layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Figure 1:
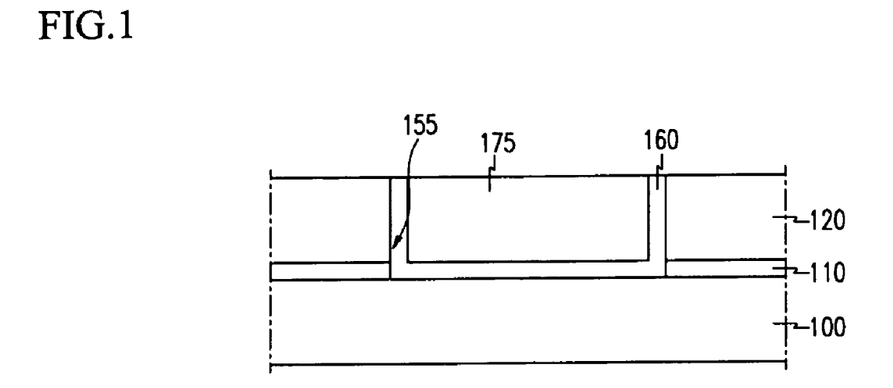
FIG. 1 is a schematic cross-sectional view of an interconnection structure of a semiconductor device according to an embodiment of the present invention.

A preferred embodiment of the present invention as shown in FIG. 1 will now be described with reference to the accompanying drawings.

FIG. 1 is a schematic cross-sectional view of an interconnection structure of a semiconductor device according to an embodiment of the present invention.

Referring to FIG. 1, an intermetal insulating layer 120 is formed on a semiconductor substrate 100 having an underlying structure of a metal plug, etc. The intermetal insulating layer 120 is made of oxide series materials or low dielectric constant materials, and includes a trench 155 by which a portion of the substrate 100 is exposed. The intermetal insulating layer 120 can be formed as plural layers according to process properties and process conditions.

A diffusion barrier 160 is formed to the inner surface of the trench 155 of the intermetal insulating layer 120. A conductive layer made of Cu, etc. is deposited on the surface of the diffusion barrier 160, and the diffusion barrier 160 is filled with an interconnect metal 175. Furthermore, an etch-stop layer 110 is interposed between the substrate 100 and the intermetal insulating layer 120, to prevent the etching from attacking the underlying structure of the substrate 100 which underlies the trench 155 in the etching process for forming the trench 155.

A method of fabricating the above-mentioned interconnection structure of the semiconductor device according to an embodiment of the present invention will now be described with reference to the accompanying drawings.

FIGS. 2A through 2E are schematic cross-sectional views showing process steps to fabricate an interconnection structure of a semiconductor device according to an embodiment of the present invention.

Figure 2A:
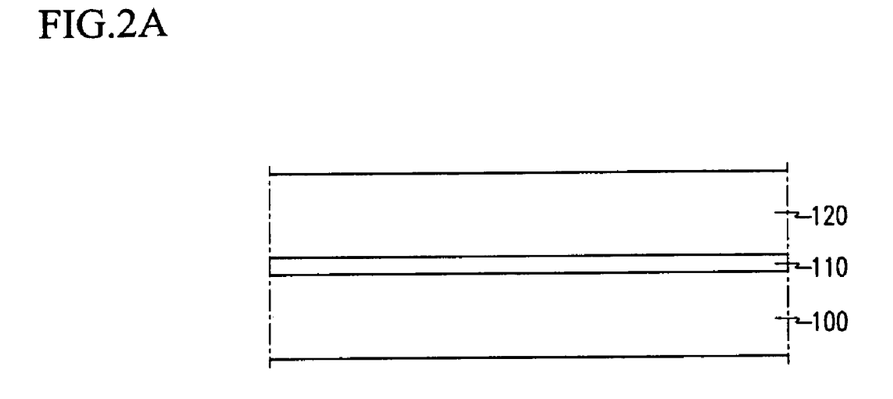
FIGS. 2A through 2E are schematic cross-sectional views showing process steps to fabricate an interconnection structure of a semiconductor device according to an embodiment of the present invention.

As shown in FIG. 2A, an etch-stop layer 110 and an intermetal insulating layer 120 are successively deposited on a substrate 100 having an underlying structure of a plug, etc. Here, the etch-stop layer 110 is formed of a nitride layer, and the intermetal insulating layer 120 is made of oxide series materials or low dielectric constant materials. Also, the intermetal insulating layer 120 can be formed as plural layers using the same or different oxide series materials according to process properties and process conditions.

Figure 2B:
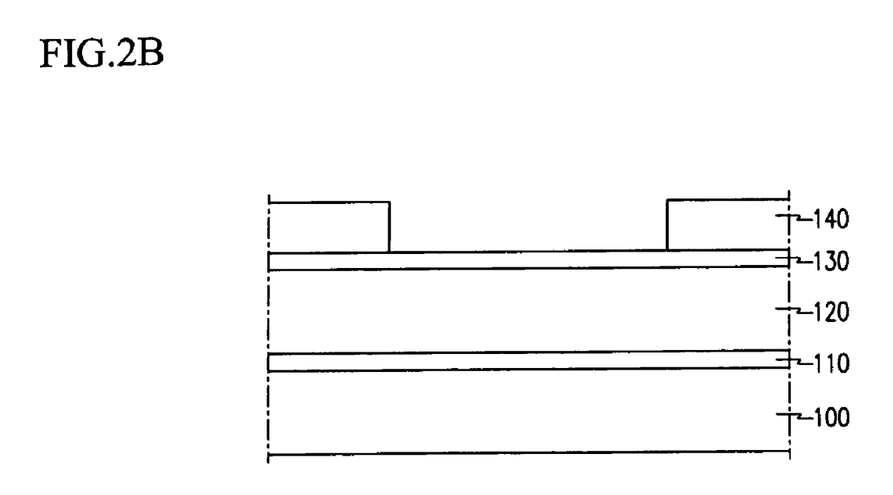

Next, as shown in FIG. 2B, a sacrificial insulating layer 130 is formed on the intermetal insulating layer 120. A thickness of the sacrificial insulating layer 130 is equal to or larger than that of the etch-stop layer 110 in order to protect the intermetal insulating layer 120 from the etching process for the removal of the etch-stop layer 110 illustrated in the following (e.g., FIG. 2D). In particular, the etch-stop layer is as much as twice as thick as the sacrificial insulating layer 130, such that a range of thickness ratio (etch stop/sacrificial layer) may be in an inclusive range of 2 to 1, although a less ratio is more idea (e.g., 1.05:1, 1.1:1, 1.15:1, 1.2:1 or 1.25:1). In addition, the sacrificial insulating layer 130 is preferably formed of nitride series materials.

Subsequently, a photoresist layer is deposited on the sacrificial layer 130, and irradiating and developing are then performed to form a photoresist pattern 140 which defines a trench formation region to form an interconnection line.

Figure 2C:
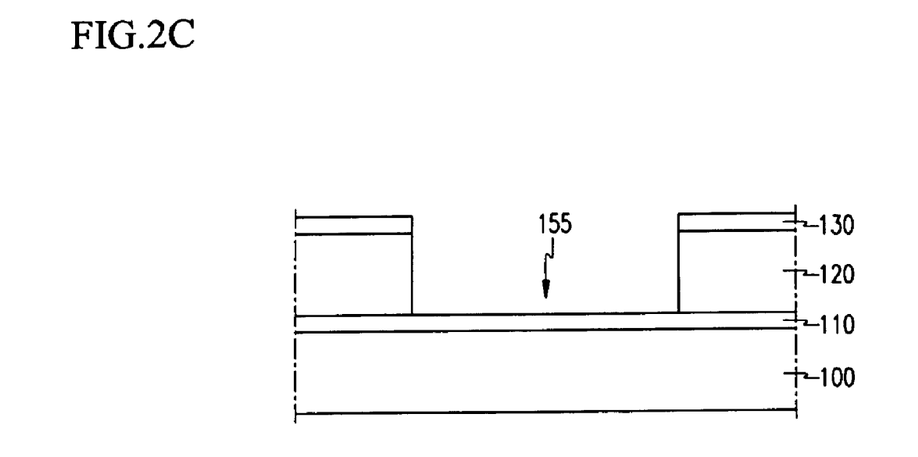

Next, as shown in FIG. 2C, the sacrificial insulating layer 130 and the intermetal insulating layer 120 are etched using a mask of the photoresist pattern 140, thereby forming a trench 155 completing a single damascene pattern in the intermetal insulating layer 120. In this step, the substrate 100 having the underlying structure of a plug, etc. is protected by the etch-stop layer 110.

Figure 2D:
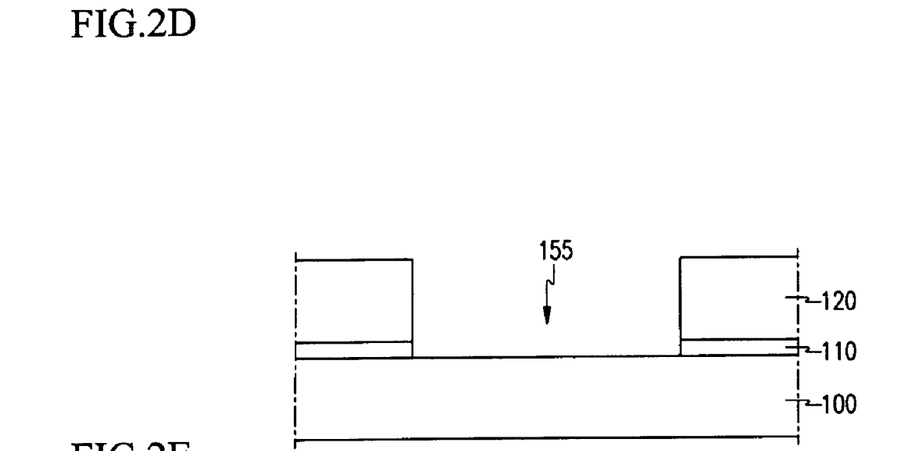

Next, as shown in FIG. 2D, the etch-stop layer 110 underlying the trench 155 is removed. In this etching, the partial opening sidewalls of the trench 155 can also be removed. However, according to the embodiment of the present invention, the sacrificial insulating layer 130 having a thickness equal to or larger than that of the etch-stop layer 110 is partially (or nearly completely) removed along with the etch-stop layer 110, thereby preventing the intermetal insulating layer 120 underlying the sacrificial insulating layer 130 from being etched. This method can prevent a profile of the trench 155 from being determined by a profile of the intermetal insulating layer 120. In other words, it prevents the opening of the trench 155 from widening.

Figure 2E:
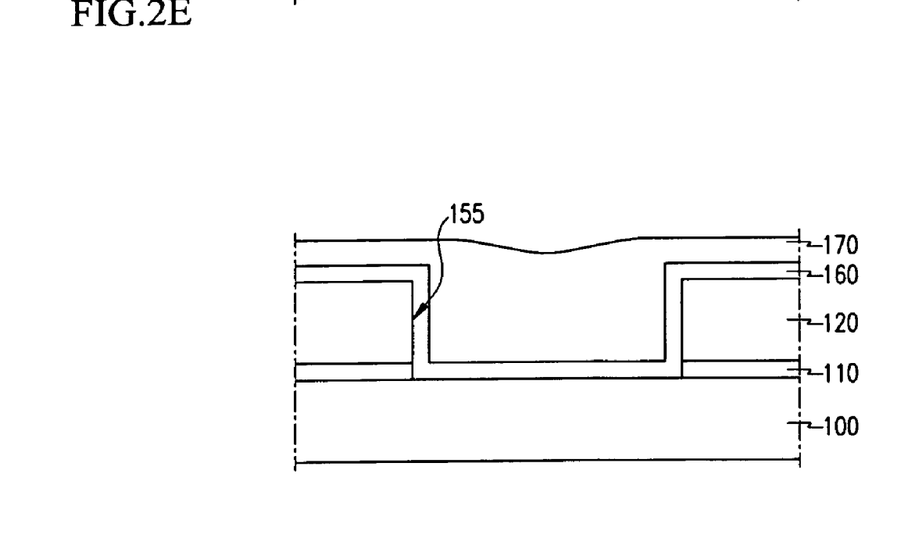

Next, as shown in FIG. 2E, a diffusion barrier 160 is formed using tantalum silicon nitride (TaSiN), etc. to the inner surface of the trench 155 and on the intermetal insulating layer 120. A conductive layer 170 is then sufficiently deposited using Cu, etc. over the intermetal insulating layer 120 including the diffusion barrier 160 to completely fill the trench 155.

Next, annealing of the conductive layer 170 is performed to remove impurities introduced during the deposition process of the conductive layer 170.

Next, chemical mechanical polishing (CMP) is performed until the upper surface of the intermetal insulating layer 120 is exposed and planarized. After the CMP process, the conductive layer 170 remains only in the trench 155, and an interconnection structure 175 having the conductive layer 170 is completed.

Other preferred embodiments of the present invention will be now described with reference to FIG. 3 and FIGS. 4A through 4G.

Figure 3:
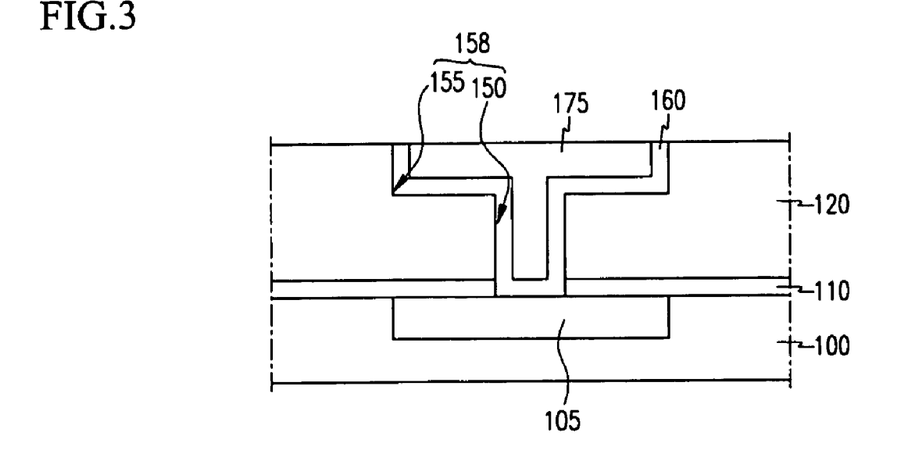
FIG. 3 is a schematic cross-sectional view of an interconnection structure of a semiconductor device according to another embodiment of the present invention.

FIG. 3 is a schematic cross-sectional view of an interconnection structure of a semiconductor device according to another embodiment of the present invention.

Referring to FIG. 3, an intermetal insulting layer 120 is formed on a semiconductor substrate 100 having an underlying structure which includes a lower interconnect metal 105, etc. The intermetal insulating layer 120 is made of oxide series materials or low dielectric constant materials, and includes a dual damascene pattern 158 by which the lower interconnection 105 is partially exposed. The dual damascene pattern 158 is comprised of a via hole 150 which connects an upper interconnection with a lower interconnection, and a trench 155 in which an upper interconnection will be formed.

A diffusion barrier 160 is formed to the inner surface of the dual damascene pattern 158 of the intermetal insulating layer 120.

Also, a conductive layer made of Cu, etc. is formed on the diffusion barrier 160, and an upper interconnect metal 175 is filled in the dual damascene pattern 158.

A method of fabricating the above-mentioned interconnection structure of the semiconductor device according to another embodiment of the present invention will be now described with reference to the accompanying drawings.

FIGS. 4A through 4E are schematic cross-sectional views showing process steps to fabricate an interconnection structure of a semiconductor device according to another embodiment of the present invention.

Figure 4A:
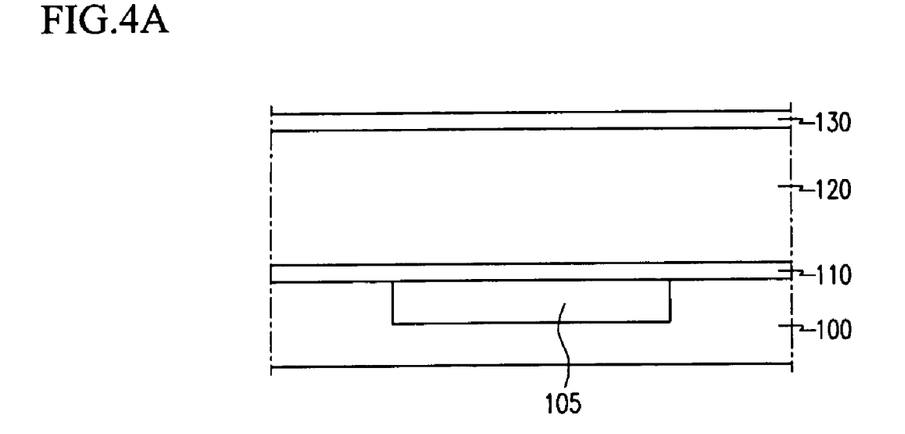
FIGS. 4A through 4G are schematic cross-sectional views showing process steps to fabricate an interconnection structure of a semiconductor device according to another embodiment of the present invention.

As shown in FIG. 4A, an etch-stop layer 110 and an intermetal insulating layer 120 are successively deposited on a semiconductor substrate 100 having a lower interconnect metal 105. Here, the etch-stop layer 110 is formed of a layer of nitride, and the intermetal insulating layer 120 is made of oxide series materials or low dielectric constant materials. Also, the intermetal insulating layer 120 can be formed as plural layers using the same or different oxide series materials according to process properties and conditions.

Figure 4B:
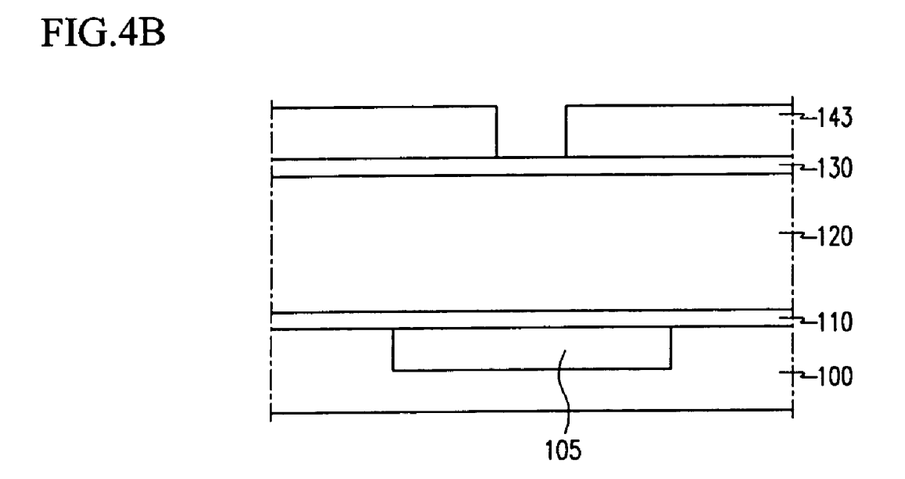

As shown in FIG. 4B, a sacrificial insulating layer 130 is formed on the intermetal insulating layer 120. A thickness of the sacrificial insulating layer 130 is equal to or larger than that of the etch-stop layer 110 in order to protect the intermetal insulating layer 120 from the etching process of the etch-stop layer 110 illustrated in the following (e.g., FIG. 4F). In addition, the sacrificial insulating layer 130 is preferably formed of nitride series materials.

Subsequently, a photoresist layer is deposited on the sacrificial layer 130, and then exposing and developing are performed to form a first photoresist pattern 143 which defines a via hole formation region to connect the upper and lower interconnections.

Figure 4C:
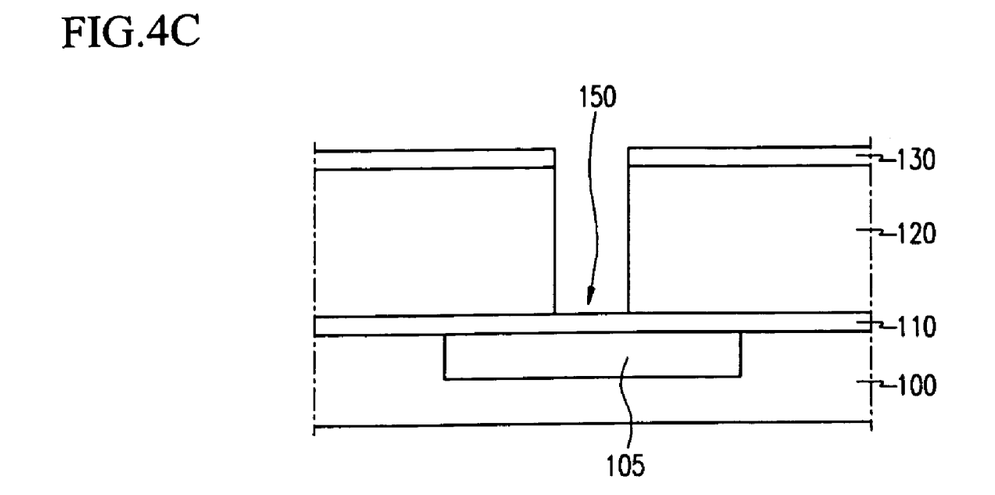

Next, as shown in FIG. 4C, the sacrificial insulating layer 130 and the intermetal insulating layer 120 are etched using a mask of the first photoresist pattern 143, thereby forming a via hole 150 in the intermetal insulating layer 120. In this step, the wafer overlying the lower interconnect metal 105 is protected from the etching by the etch-stop layer 110 on the wafer 100.

The first photoresist pattern 143 on the sacrificial insulating layer 130 is then removed.

Figure 4D:
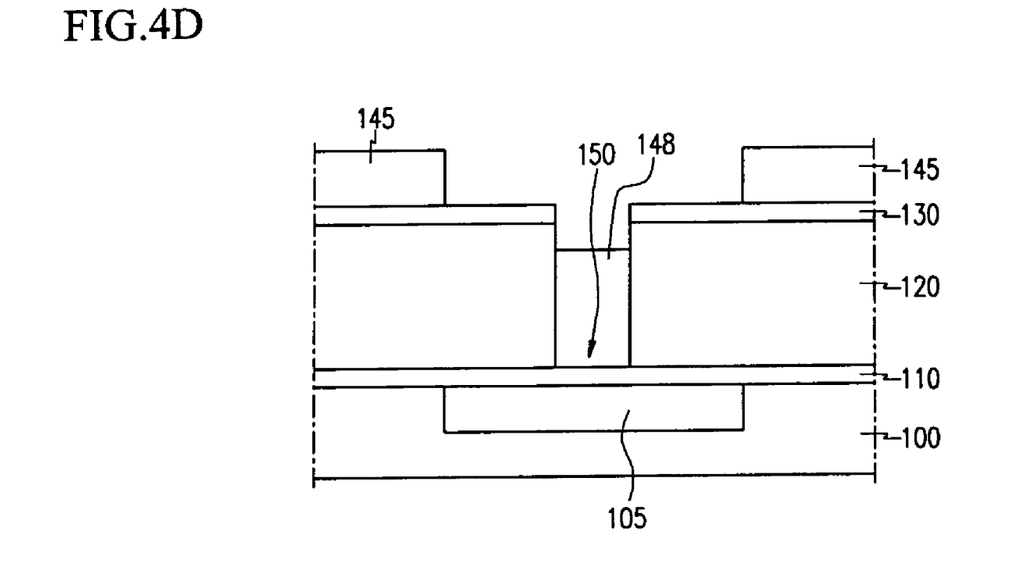

Next, as shown in FIG. 4D, a photoresist layer is deposited again on the sacrificial layer 130, and then exposing and developing are performed to form a second photoresist pattern 145 which defines a trench formation region where an interconnect metal will be filled.

Next, a non-photoresist material 148 is filled in the via hole 150 to prevent subsequent etching for forming a trench from attacking the via hole 150. However, this filling process is not an essential process and can be omitted according to process properties and process conditions.

Figure 4E:
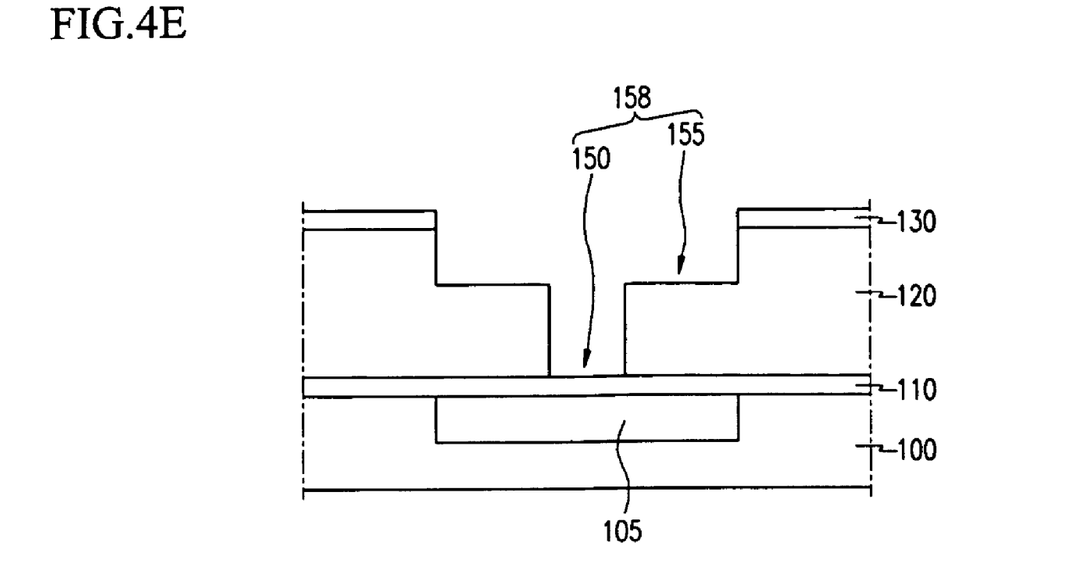

Next, as shown in FIG. 4E, the partial sacrificial insulating layer 130 and the partial intermetal insulating layer 120 are etched using a mask of the second photoresist pattern 143, thereby forming a dual damascene pattern 158. The resulting dual damascene pattern 158 includes the via hole 150 which connects the upper interconnection with the lower interconnection, and a trench 155 in which an upper interconnection will be formed.

Figure 4F:
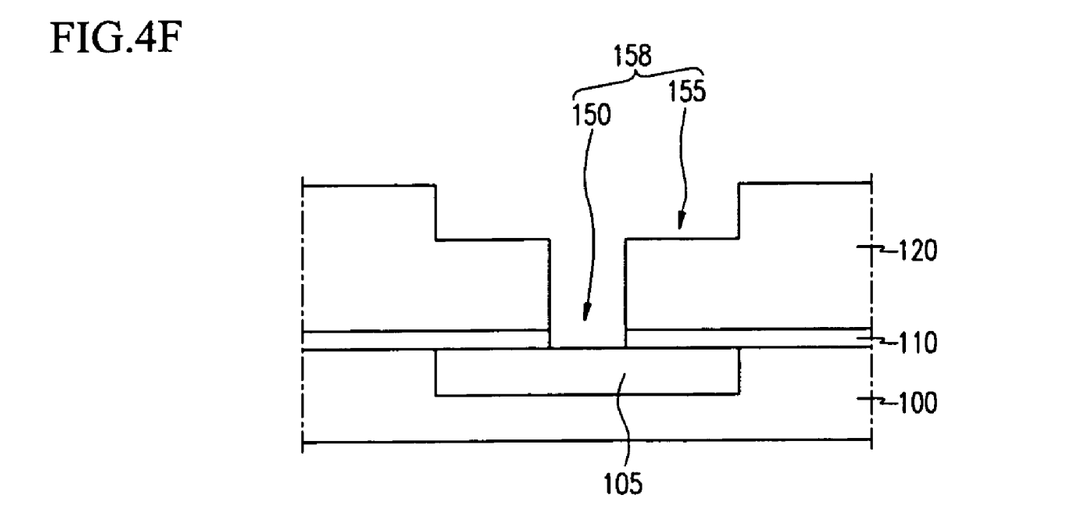

Next, as shown in FIG. 4F, the portion of the etch-stop layer 110 underlying the via hole 150 is removed. In this etching process, in general, the partial opening sidewalls of the dual damascene pattern 158 can also be removed. However, according to the embodiment of the present invention, the sacrificial insulating layer 130 having a thickness equal to or larger than that of the etch-stop layer 110 is partially removed along with the etch-stop layer 110, thereby preventing the intermetal insulating layer 120 underlying the sacrificial insulating layer 130 from being etched. This method can prevent a profile of the dual damascene pattern 158 from being determined by a profile of the intermetal insulating layer 120. In other words, it prevents the opening of the trench 155 from widening.

Figure 4G:
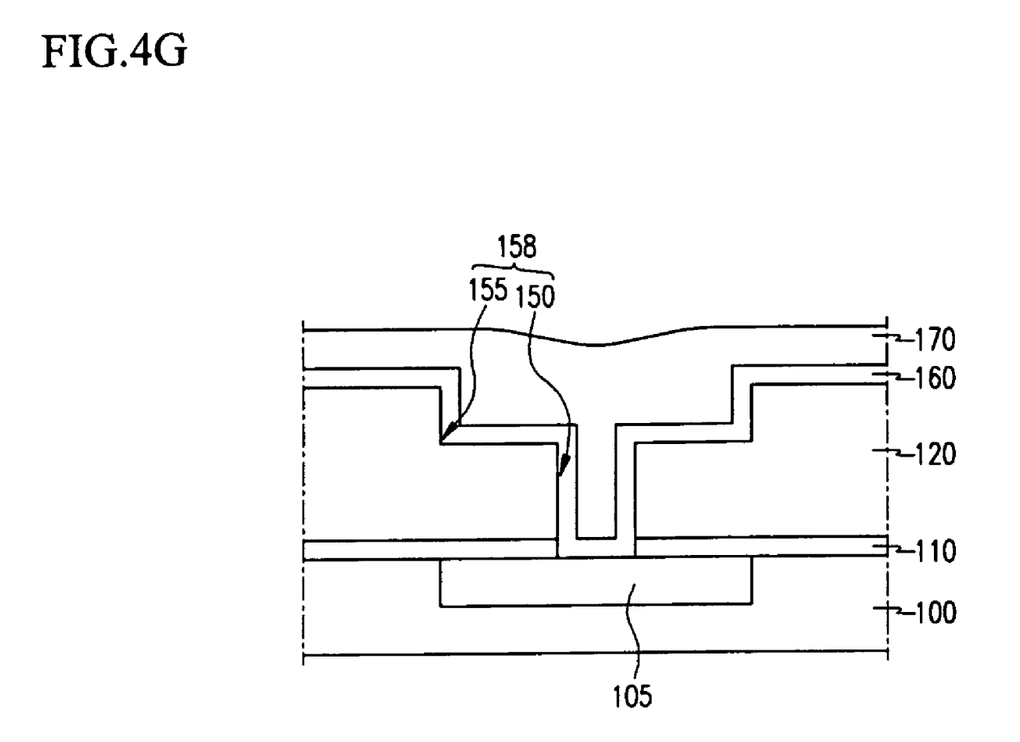

Next, as shown in FIG. 4G, a diffusion barrier 160 is formed using TaSiN, etc. to the inner surface of the dual damascene pattern 158 and on the intermetal insulating layer 120. A conductive layer 170 is then sufficiently deposited using Cu, etc. on the intermetal insulating layer 120 including the diffusion barrier 160, to fill the dual damascene pattern 158 completely.

Next, annealing of the conductive layer 170 is performed to remove impurities introduced during the deposition process of the conductive layer 170.

Next, as shown in FIG. 3, chemical mechanical polishing (CMP) is performed until the upper surface of the intermetal insulating layer 120 is exposed and planarized. As a result, the conductive layer 170 remains only in the trench 155, and an interconnection structure 175 having the conductive layer is completed.

As mentioned above, the present invention prevents the opening sidewalls of the damascene pattern from being rounded, so that a bridge phenomenon in which adjacent interconnection lines are connected to each other is prevented. In addition, it minimizes a leakage current generated by the rounded opening sidewalls of the damascene pattern, enabling stable device properties and device operation.

The present application contains subject matter related to that disclosed in Korean patent application No. 10-2003-0101823, filed on Dec. 31, 2003, the entire contents of which being incorporated herein by reference.

The present invention should not be considered to be limited to the particular examples described above, but rather should be understood to cover all aspects of the invention as set out in the attached claims. Various modifications, equivalent processes, as well as numerous structures to which the present invention may be applicable will be readily apparent to those of skill in the art to which the present invention is directed upon review of the instant specification.

What is claimed is:

1. A method of fabricating an interconnection structure of a semiconductor device comprising the steps of:

successively depositing an etch-stop layer and an intermetal insulating layer on a semiconductor substrate;

forming a sacrificial insulating layer on the intermetal insulating layer, wherein a thickness ratio of said etch-stop layer to said sacrificial insulating layer is in an inclusive range of 2:1 through 1:1;

forming a photoresist pattern on the sacrificial insulating layer to define a trench formation region;

etching the intermetal insulating layer using a photoresist pattern as a mask to form a trench and expose a portion of the etch-stop layer; and etching the portion of the etch-stop layer and the sacrificial insulating layer.

2. The method of claim 1, wherein the step of forming the sacrificial insulating layer includes using nitride series materials.

3. The method of claim 1, wherein the thickness ratio is in an inclusive range of 1.2:1 through 1:1.

4. The method of claim 1, wherein the step of forming the intermetal insulating layer includes forming plural layers using oxide series materials.

5. The method of claim 1, further comprising the steps of:

forming a diffusion barrier on the intermetal insulating layer including the trench after the entire etch-stop layer is removed;

depositing a conductive layer on the diffusion barrier to fill the trench;

annealing the conductive layer; and polishing the conductive layer and the diffusion baffler by chemical mechanical polishing until an upper surface of the intermetal insulating layer is exposed and planarized.

6. The method of claim 5, wherein the step of depositing a conductive layer includes depositing copper.

7. A method of fabricating an interconnection structure of a semiconductor device comprising the steps of:

successively depositing an etch-stop layer and an intermetal insulating layer on a semiconductor substrate;

forming a sacrificial insulating layer on the intermetal insulating layer, wherein a thickness ratio of said etch-stop layer to said sacrificial insulating layer is in an inclusive range of 2:1 through 1:1;

forming a first photoresist pattern on the sacrificial insulating layer to define a via hole formation region;

forming a second photoresist pattern on the sacrificial insulating layer to define a trench formation region;

selectively etching an exposed portion of the intermetal insulating layer using the second photoresist pattern as a mask to form a dual damascene pattern; and etching an entire exposed portion of the etch-stop layer.

8. The method of claim 7, wherein the step of forming a sacrificial insulating layer includes using nitride series materials.

9. The method of claim 7, the thickness ratio is in an inclusive range of 1.2:1 through 1:1.

10. The method of claim 7, wherein the step of forming the intermetal insulating layer includes forming plural layers using oxide series materials.

11. The method of claim 7, wherein the selective etching step of the partial intermetal insulating layer using a mask of the second photoresist pattern to form a dual damascene pattern step comprises the steps of:

filling the via hole with a non-photoresist material to protect the etch-stop layer;

etching the exposed portion of the intermetal insulating layer using a mask of the second photoresist pattern to form a trench; and completely removing the non-photoresist material.

12. The method of claim 7, further comprising the steps of:

forming a diffusion barrier on the intermetal insulating layer including the dual damascene pattern after the exposed portion of the etch-stop layer is removed;

depositing a conductive layer on the diffusion barrier to fill the trench;

annealing the conductive layer; and polishing the conductive layer and the diffusion barrier by chemical mechanical polishing until the upper surface of the intermetal insulating layer is exposed and planarized.

13. The method of claim 12, wherein the depositing step includes depositing copper.

* * * * *